US006725538B2

(12) United States Patent
Sato

(10) Patent No.: US 6,725,538 B2
(45) Date of Patent: Apr. 27, 2004

(54) METHOD OF CONNECTING A TERMINAL TO A CONDUCTOR

(75) Inventor: Shigeru Sato, Fukuoka-ken (JP)

(73) Assignee: Ultex Corporation, Fukuoka (JP)

( * ) Notice: Subject to any disclaimer, the term of this patent is extended or adjusted under 35 U.S.C. 154(b) by 0 days.

(21) Appl. No.: 09/893,462

(22) Filed: Jun. 29, 2001

(65) Prior Publication Data

US 2001/0037569 A1 Nov. 8, 2001

Related U.S. Application Data

(63) Continuation-in-part of application No. 09/320,722, filed on May 27, 1999.

(30) Foreign Application Priority Data

Jun. 16, 1998 (JP) .......................................... 10-168990

(51) Int. Cl.[7] ............................ B23K 5/20; H01R 9/00; H05K 3/00

(52) U.S. Cl. ............................ 29/844; 29/874; 29/882; 228/110.1; 228/1.1

(58) Field of Search .......................... 29/844, 882, 874; 228/110.1, 1.1, 155, 158

(56) References Cited

U.S. PATENT DOCUMENTS 3,367,809 A * 2/1968 Soloff
3,483,611 A * 12/1969 Balamuth et al.
3,499,808 A * 3/1970 Obeda
4,106,962 A * 8/1978 Adams et al.
4,857,482 A * 8/1989 Saito et al.
4,865,680 A * 9/1989 Pierson .................... 228/1.1 X
5,323,952 A * 6/1994 Kato et al.
5,676,304 A * 10/1997 Matsui et al. ............ 228/110.1
5,894,983 A * 4/1999 Beck et al. .............. 228/110.1
5,948,286 A * 9/1999 Chalco et al.
5,954,549 A * 9/1999 Shinchi

* cited by examiner

*Primary Examiner*—Ljiljana Ciric
(74) *Attorney, Agent, or Firm*—Kanesaka & Takeuchi

(57) ABSTRACT

A method of connecting a terminal to a conductor comprises the steps of mating the terminal with the conductor through a thin stud of the terminal projecting from a base of the termina, giving ultrasonic vibration to the base of the terminal and the conductor to join the terminal and the conductor laminate at mating portion. The method further comprises the step of crushing a portion of the stud projecting above the conductor by giving a pressure without the ultrasonic vibration to the portion of the stud, thus to caulk the terminal to the conductor.

5 Claims, 3 Drawing Sheets

METHOD OF CONNECTING A TERMINAL TO A CONDUCTOR

This application is continuation-in-part of U.S. application Ser. No. 09/320,722, filed on May 27, 1999, which claims the benefit of Japanese Application No. 10-168990, filed on Jun. 16, 1998.

BACKGROUND OF THE INVENTION

1. Field of the Invention

The present invention relates to connected body comprising a terminal and a belt-like conductor laminate, or conductor (which is equivalent to the belt-like conductor laminate when used in the disclosure) and to a method for connecting a terminal to a belt-like conductor laminate.

2. Description of the Prior Art

FIG. 5 shows a connected body comprising a terminal 1 for an electric part such as a capacitor or battery and a belt-like conductor laminate 2 formed by piling up a plurality of thin belt-like conductors as an example of a connected body comprising a terminal 1 and a belt-like conductor laminate 2 of the prior art. Before the terminal 1 is connected to the belt-like conductor laminate 2, the terminal 1 is integrated with the cap 9 of an electric part by insert molding. That is, the terminal 1 is made from a metal material having small electric resistance and has a thin stud 1*b* projecting from the surface of a base 1*a* and a thin external electrode 1*c* coaxial to the stud 1*b* and projecting from the rear surface of the base 1*a*. Insert molding is for obtaining a molded piece comprising the base 1*a* of the terminal 1 integrated with the molded cap 9 by placing the above terminal 1 in a cap mold as an insert member, charging a synthetic resin as a material for molding the cap 9 into a molding space formed in the inside of the cap mold containing the terminal 1 to mold a molded piece consisting of the terminal 1 and the cap 9 and releasing the molded piece from the cap mold. Before the terminal 1 is connected to the belt-like conductor laminate 2, the belt-like conductor laminate 2 has a through hole 2*a* into which the stud 1*b* can be inserted in a portion specified as a connection portion with the terminal 1. The connected body is formed by caulking the above terminal 1 to the belt-like conductor laminate 2. To this end, the stud 1*b* of the terminal 1 is first inserted into the through hole 2*a* of the belt-like conductor laminate 2 so that the terminal 1 is mated with the belt-like conductor laminate 2 by the stud 1*b* and the through hole 2*a*. Thereafter, a pressing member such as a washer is fitted onto a portion projecting from the belt-like conductor laminate 2 of the stud 1*b*. In this state, a portion projecting from the pressing member 10 of the stud 1*b* is crushed to caulk the terminal 1 to the belt-like conductor laminate 2.

SUMMARY OF THE INVENTION

In the connected body comprising the terminal 1 and the belt-like conductor laminate 2 formed by caulking and the method for connecting the terminal 1 to the charted body 2 of the prior art, it is possible that electric conductivity is insufficient though mechanical strength is relatively high. This is because the mating portions of the terminal 1 and the belt-like conductor laminate 2 are merely strongly contacted to each other by caulking by crushing the stud 1*b*. When the contact surfaces of the terminal 1 and the belt-like conductor laminate 2 are observed microscopically, there are a large number of extremely small spaces between the contact surfaces.

It is therefore an object of the present invention to provide a connected body comprising a terminal and a belt-like conductor laminate and having high mechanical and electric reliabilities and a method for connecting the terminal to the belt-like conductor laminate.

According to a first aspect of the present invention, there is provided a connected body in which mating portions of a belt-like conductor laminate mated with a thin stud projecting from the base of a terminal and the base are joined together with ultrasonic vibration, and a crushed portion formed by caulking a portion projecting from the belt-like conductor laminate of the stud supports the belt-like conductor laminate with the base.

According to a second aspect of the present invention, there is provided a connected body in which mating portions of a belt-like conductor laminate mated with a thin stud projecting from the base of a terminal and the base are supported by a crushed portion formed by caulking a portion projecting from the belt-like conductor laminate of the stud and the base, and part of the belt-like conductor laminate outside the crushed portion is folded down and joined to the top surface of the crushed portion with ultrasonic vibration.

According to a third aspect of the present invention, there is provided a connection method which comprises the steps of mating a thin stud projecting from the base of a terminal with a belt-like conductor laminate, giving ultrasonic vibration to the outside of at least one of the base of the terminal and the belt-like conductor laminate to join the mating portions of the base and the belt-like conductor laminate, and crushing a portion projecting from the belt-like conductor laminate of the stud to caulk the terminal to the belt-like conductor laminate.

According to a fourth aspect of the present invention, there is provided a connection method which comprises the steps of mating a thin stud projecting from the base of a terminal with a belt-like conductor laminate, crushing a portion projecting from the belt-like conductor laminate of the stud to caulk the terminal to the belt-like conductor laminate, folding down one side of the belt-like conductor laminate with the stud as a boundary between it and the other side, placing it upon the crushed portion of the stud, and giving ultrasonic vibration to the outside of at least one of the base of the terminal and the belt-like conductor laminate to join the mating portions of the crushed portion of the stud and the belt-like conductor laminate.

According to a fifth aspect of the present invention, there is provided a connection method in which ultrasonic vibration is given to the outside of the belt-like conductor laminate.

According to a seventh aspect of the present invention, there is provided a connection method in which a through hole for the stud is formed in the belt-like conductor laminate so that the stud is mated with the belt-like conductor laminate by the through hole.

According to a seventh aspect of the present invention, there is provided a connection method in which after joining with ultrasonic vibration, a pressing member is fitted onto the portion projecting from the belt-like conductor laminate of the stud and a portion projecting from the pressing member of the stud is crushed to caulk the terminal to the belt-like conductor laminate.

The above and other objects, features and advantages of the invention will become more apparent from the following description when taken in conjunction with the accompanying drawings.

BRIEF DESCRIPTION OF THE ACCOMPANYING DRAWINGS

DETAILED DESCRIPTION OF THE PREFERRED EMBODIMENTS

Embodiment 1

Figure 1:
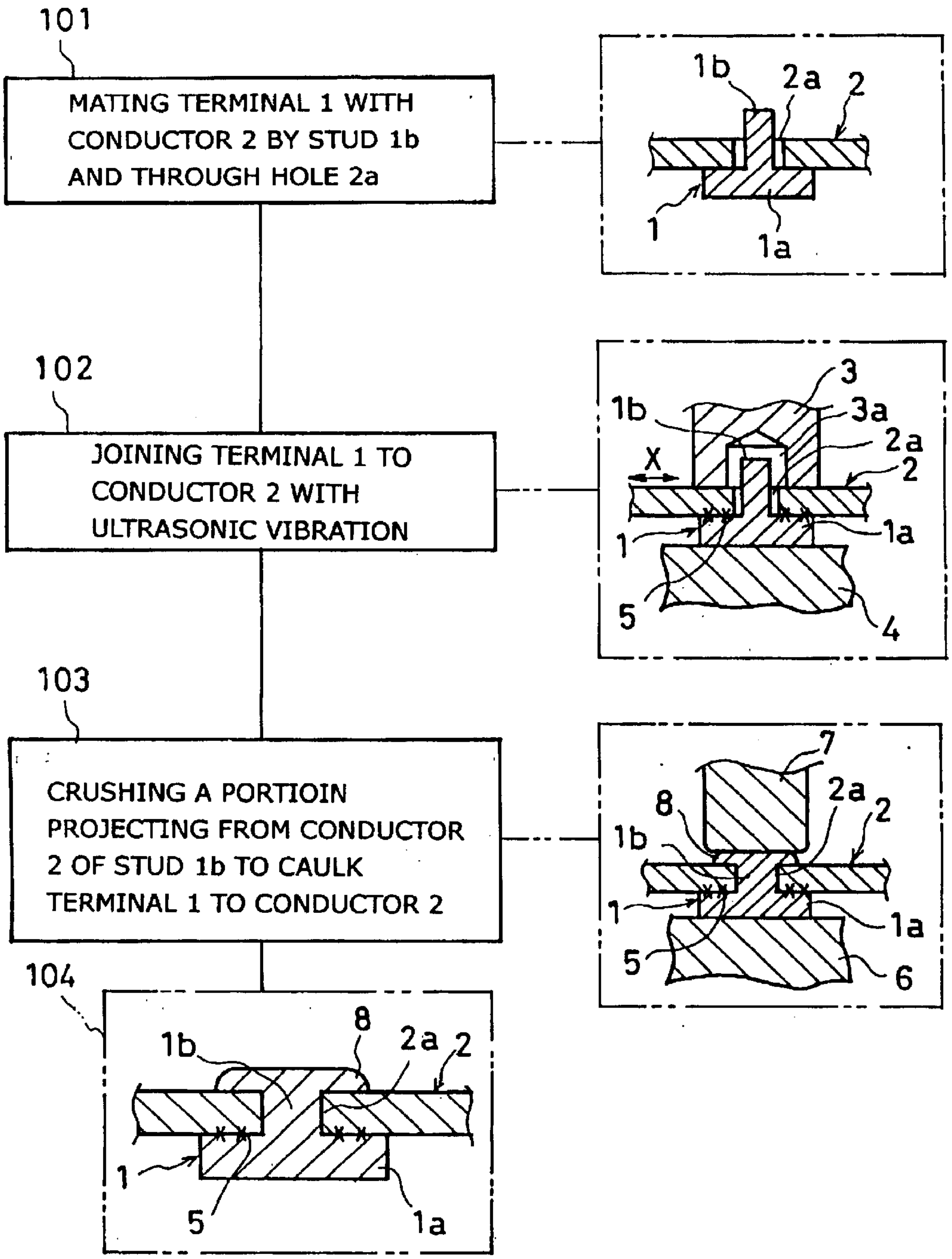
FIG. 1 is a flow chart showing Embodiment 1 of the present invention.

With reference to FIG. 1, a connected body and a connection method according to Embodiment 1 of the present invention will be described hereinafter. Before a terminal 1 and a belt-like conductor laminate 2 are connected to each other, the terminal 1 is made from a metal material having small electric resistance and a stud 1*b* projects from the surface of a base 1*a* so that the base 1*a* exists around the thin stud 1*b*. Before the terminal 1 and the belt-like conductor laminate 2 are connected to each other, the belt-like conductor laminate 2 is a laminate consisting of a plurality of thin belt-like conductors having small electric resistance which are placed one upon another and joined together and has a through hole 2*a* into which the stud 1*b* can be inserted in a portion specified as a connection portion with the terminal 1.

To form the connected body comprising the above terminal 1 and belt-like conductor laminate 2, the stud 1*b* is inserted into the through hole 2*a* in step 101 so that the terminal 1 and the belt-like conductor laminate 2 are mated with each other by the stud 1*b* and the through hole 2*a*. In the next step 102, the terminal 1 and the belt-like conductor laminate 2 mated with the terminal 1 are joined together with ultrasonic vibration. Thereafter, in step 103, a portion projecting from the belt-like conductor laminate 2 of the stud 1*b* is crushed to caulk the terminal 1 to the belt-like conductor laminate 2.

A method for connecting the terminal 1 to the belt-like conductor laminate 2 with ultrasonic vibration will be described with reference to a figure within a frame shown by a virtual line on the right side of step 102. This connection method uses an ultrasonic vibration connection device, for example. The terminal 1 mated with the belt-like conductor laminate 2 is placed on a workpiece mounting table 4 right below the connection tool 3 of the ultrasonic vibration connection device with a predetermined interval therebetween. This state is such that the rear surface on a side opposite to the stud 1*b* of the terminal 1 is in contact with the top surface of the workpiece mounting table 4 and that the stud 1*b* and the belt-like conductor laminate 2 face the connection tool 3. Thereafter, the connection tool 3 having a relief hole 3*a* in the end surface is moved down by the pressure drive unit of the ultrasonic vibration connection device, the relief hole 3*a* of the connection tool 3 thereby contains the portion projecting from the belt-like conductor laminate 2 of the stud 1*b* coaxially without contact, the annular end surface around the relief hole 3*a* of the connection tool 3 contacts the belt-like conductor laminate 3 around the stud 1*d*, and the connection tool 3 presses the base 1*a* and the belt-like conductor laminate 2 in a direction that they approach each other with a predetermined pressure together with the workpiece mounting table 4.

This pressure force is set to a predetermined value according to the materials and physical properties such as thickness of the belt-like conductor laminate 2 and the terminal 1 to be joined together with ultrasonic vibration and determined by the amount of the downward movement of the pressure drive unit which is set to achieve the above predetermined value. For instance, the distance between the top surface of the workpiece mounting table 4 and the top surface of the belt-like conductor laminate 2 (the surface that the connection tool 3 contacts) before the base 1*a* and the belt-like conductor laminate 2 are pressed by the connection tool 3 and the workpiece mounting table 4 is compared with the distance between the top surface of the workpiece mounting table 4 and the top surface of the belt-like conductor laminate 2 (the surface that the connection tool 3 contacts) after the base 1*a* and the belt-like conductor laminate 2 are pressed by the connection tool 3 and the workpiece mounting table 4, and the relationship between the pressure and the amount of downward movement is obtained from experiments on correlation between the pressure and the amount of downward movement to find how much pressure is applied to the base 1*a* and the belt-like conductor laminate 2 when the distance after the application of pressure is reduced from the distance before the application of pressure by a certain value. By using the amount of downward movement, the base 1*a* and the belt-like conductor laminate 2 can be pressed with a predetermined pressure by the connection tool 3 and the workpiece mounting table 4. A pressure sensor may be provided to the pressure drive unit so that the pressure drive unit is controlled to stop downward movement and to maintain the stop position when the pressure sensor detects a predetermined pressure, thereby making it possible for the connection tool 3 and the workpiece mounting table 4 to press the base 1*a* and the belt-like conductor laminate 2 with a predetermined pressure.

While the base 1*a* and the belt-like conductor laminate 2 are sandwiched between the connection tool 3 and the workpiece mounting table 4 and pressed with a predetermined pressure, ultrasonic vibration is transmitted to the connection tool 3 from a transducer which is an electro-acoustic converter or electro-vibration converter composed of a piezoelectric element or magnetostrictive element for converting into mechanical energy electric energy for generating and outputting vibration of a vertical ultrasonic wave having a predetermined frequency with power supplied from the ultrasonic generator of the ultrasonic vibration connection device through a booster or an ultrasonic horn. Then, the connection tool 3 resonates with the transmitted ultrasonic vibration and the resonance (the direction of this vibration is a horizontal direction shown by an arrow X) is given to the outside of the belt-like conductor laminate 2 for a predetermined time. Thereby, the resonance of the connection tool 3 is transmitted through the inside of the belt-like conductor laminate 2 from the outside of the belt-like conductor laminate 2 and joins together the plurality of conductors forming the belt-like conductor laminate 2 and also the mating portions of the belt-like conductor laminate 2 and the base 1*a*. Thereafter, the pressure drive unit goes up and the connection tool 3 moves away from the terminal 1 and the belt-like conductor laminate 2 joined to the terminal 1 and stops with a predetermined interval between it and the workpiece mounting table 4. In this state, an intermediate product consisting of the terminal 1 and the belt-like conductor laminate 2 joined to the terminal 1 is removed from the workpiece mounting table 4.

With reference to a figure within a frame shown by a virtual line on the right side of step 103, a method for caulking the terminal 1 to the belt-like conductor laminate 2 by crushing a portion projecting from the belt-like conductor laminate 2 of the stud 1*b* of the intermediate product removed from the ultrasonic vibration connection device will be described hereinafter. This caulking can be carried out manually or by a press machine. In an either case, the intermediate product is placed on a workpiece mounting table 6 for caulking. The intermediate product is placed on the workpiece mounting table 6 in such a manner that the rear surface on a side opposite to the stud 1*b* of the terminal 1 is in contact with the top surface of the workpiece mounting table 6 and that the stud 1*b* and the belt-like conductor laminate 2 face a caulking tool 7. In this state, the portion projecting from the belt-like conductor laminate 2 of the stud 1*b* is crushed by the caulking tool 7. This caulking tool 7 may be a hammer when caulking is carried out manually or may be stricken by a hammer. When the press machine is used, the caulking tool 7 is attached to the ram of the press machine and crushes the stud 1*b* by the downward movement of the ram. That is, while the intermediate product is placed on the workpiece mounting table 4, the end surface of the caulking tool 7 strikes the top surface of the portion projecting from the belt-like conductor laminate 2 of the stud 1*b* toward the base 1*a* with predetermined forging force, the portion projecting from the belt-like conductor laminate 2 of the stud 1*b* is thereby crushed by the caulking tool 7, the stud 1*b* is elastically deformed between the workpiece mounting table 6 and the caulking tool 7, part of the stud 1*b* spreads in the entire through hole 2*a* of the belt-like conductor laminate 2 and contacts the through hole 2*a* without a space therebetween, other part of the stud 1*b* spreads over a portion around the through hole 2*a* of the belt-like conductor laminate 2 and contacts and covers the top surface (surface on the caulking tool 7 side) of the belt-like conductor laminate 2 around the through hole 2*a* without a space therebetween, and the terminal 1 is thereby caulked to the belt-like conductor laminate 2. The portion of the stud 1*b* covering the top surface of the belt-like conductor laminate 2 is called "crushed portion" hereinafter. A connected body comprising the terminal 1 and the belt-like conductor laminate 2 shown in step 104 is obtained by the completion of this caulking.

According to Embodiment 1, since the plurality of conductors forming the belt-like conductor laminate 2 are joined together with ultrasonic vibration and the mating portions 5 are also joined together with ultrasonic vibration, the plurality of conductors forming the belt-like conductor laminate 2 are fused together and the mating portions 5 are also fused together by friction heat generated between adjacent elements when they receive ultrasonic vibration, thereby improving the electric conductivity of the connected body comprising the terminal 1 and the belt-like conductor laminate 2. Further, since the belt-like conductor laminate 2 is supported by the base 1*a* and the crushed portion 8 formed by caulking, the mechanical strength of the connected body comprising the terminal 1 and the belt-like conductor laminate 2 is improved. After joining with ultrasonic vibration, the mating portions 5 are supported by the base 1*a* and the crushed portion 8 and a portion having high electric conductivity is connected in a state that it has high mechanical strength by the above caulking method, whereby high mechanical and electric reliabilities can be suitably exhibited for a long time. Since the belt-like conductor laminate 2 has the through hole 2 into which the stud 1*b* can be inserted in a portion specified as the connection portion with the terminal 1, the connection position of the terminal 1 and the belt-like conductor laminate 2 is accurately determined by mating between the stud 1*a* and the through hole 2*a*.

Embodiment 2

Figure 2:
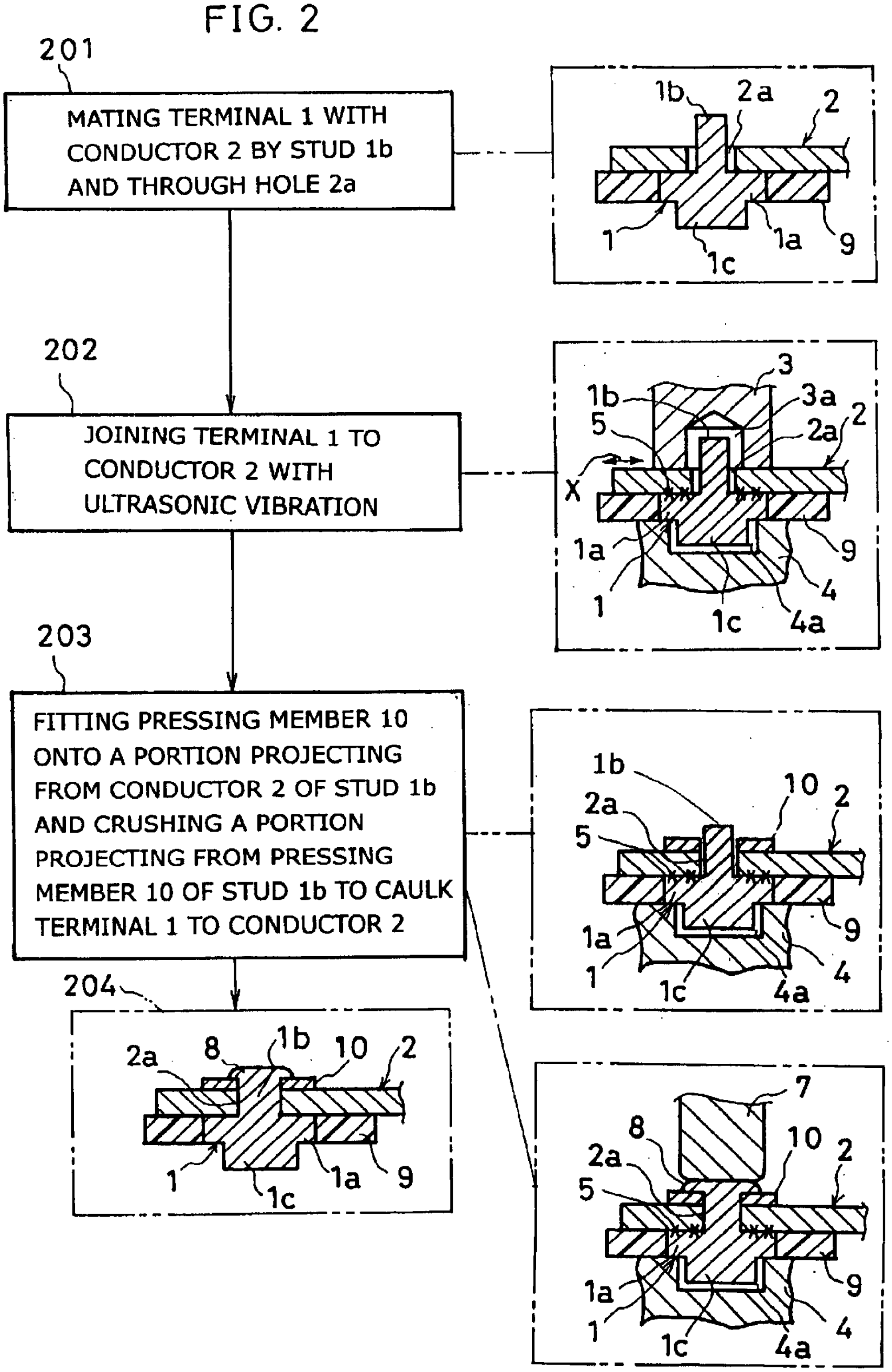
FIG. 2 is a flow chart showing Embodiment 2 of the present invention.

With reference to FIG. 2, a connected body and a connection method according to Embodiment 2 of the present invention will be described hereinafter. Embodiment 2 differs from Embodiment 1 in the shape of part of the terminal 1 and the shape of part of each of the workpiece mounting tables 4 and 6 and that a pressing member 10 such as a washer is used to caulk the terminal 1 to the belt-like conductor laminate 2. However, the belt-like conductor laminate 2 and the connection tool 3 are identical to those of Embodiment 1. Before the terminal 1 is connected to the belt-like conductor laminate 2, the terminal 1 whose thin external electrode 1*c* projects coaxial to the stud 1*b* from the rear surface of the base 1*a* is integrated with a synthetic resin cap 9 for an electric part such as a capacitor or battery by insert molding. The workpiece mounting tables 4 and 6 have relief holes 4*a* and 5*b* for containing the external electrode 1*c* coaxially without contact in the top surfaces, respectively.

To form a connected body comprising the terminal 1 and the belt-like conductor laminate 2, the terminal 1 and the belt-like conductor laminate 2 are first mated with each other by the stud 1*b* and the through hole 2*a* in step 201, and the terminal 1 and the belt-like conductor laminate 2 are joined together with ultrasonic vibration in step 102. For joining, the external electrode 1*c* is contained in the relief hole 4*a* of the workpiece mounting table 4, the stud 1*b* is contained in the relief hole 3*a* of the connection tool 3, and the base la and the belt-like conductor laminate 2 are sandwiched between the connection tool 3 and the workpiece mounting table 4 and pressed with a predetermined pressure. In this state, the resonance of the connection tool 3 which resonates with ultrasonic vibration generated by the transducer of the ultrasonic vibration connection device is transmitted through the inside of the belt-like conductor laminate 2 from the outside of the belt-like conductor laminate 2 and joins together a plurality of conductors forming the belt-like conductor laminate 2 and the mating portions 5. After the connection tool 3 is removed from the terminal 1 and the belt-like conductor laminate 2, the intermediate product consisting of the terminal 1 and the belt-like conductor laminate 2 is removed from the workpiece mounting table 4. In the subsequent step 203, a pressing member 10 having a hole with a diameter substantially equal to that of the through hole 2*a* is disposed on the belt-like conductor laminate 2 such that the pressing member 10 is aligned with the through hole 2*a* and fitted around a portion of the stud 1*b* projecting from the belt-like conductor laminate 2. Then, a portion of the stud 1*b* projection from the pressing member 10 is crushed by the caulking tool 7 to caulk the terminal 1 to the belt-like conductor laminate 2 while the external electrode 1*c* is contained in the relief hole 6*a* of the workpiece mounting table 6 and the rear surface of the base 1*a* is in contact with the top surface of the workpiece mounting table 6. No ultrasonic vibration is given when the portion of the stud projecting from the pressing member 10 is crushed. The connected body comprising the terminal 1 and the belt-like conductor laminate 2 shown in step 204 is obtained by the completion of this caulking.

According to Embodiment 2, since the pressing member 10 interposed between the crushed portion 8 and the belt-like conductor laminate 2 supports the belt-like conductor laminate 2 with the base 1*a*, the mechanical and electric reliabilities of the connected body comprising the terminal 1 and the belt-like conductor laminate 2 can be enhanced even if the outer diameter of the crushed portion 8 is small, in addition to the function and effect of the above Embodiment 1.

Embodiment 3

Figure 3:
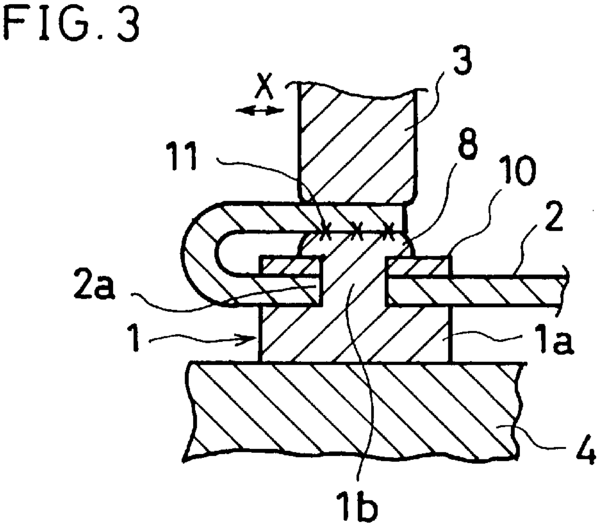
FIG. 3 is a sectional view of Embodiment 3 of the present invention.

With reference to FIG. 3, a connected body and a connection method according to Embodiment 3 of the present invention will be described hereinafter. In Embodiment 1 and Embodiment 2, the mating portions 5 joined together with ultrasonic vibration are supported by the base 1*a* and the crushed portion 8 formed by caulking. In Embodiment 3, after the terminal 1 is caulked to the belt-like conductor laminate 2, part of the belt-like conductor laminate 2 is folded down and joined to the top surface of the crushed portion 8 with ultrasonic vibration. That is, while the terminal 1 caulked to the belt-like conductor laminate 2 through the pressing member 10 is placed upon the workpiece mounting table 4 and part of the belt-like conductor laminate 2 is placed upon the crushed portion 8, the connection tool 3 is press contacted to the belt-like conductor laminate 2 placed upon the crushed portion 8 with a predetermined pressure. The resonance of the connection tool 3 which resonates with ultrasonic vibration generated by the transducer of the ultrasonic vibration connection device is transmitted through the inside of the belt-like conductor laminate 2 from the outside of the belt-like conductor laminate 2 to the mating portions 11 of the belt-like conductor laminate 2 and the crushed portion 8. In this process, the plurality of conductors forming the belt-like conductor laminate 2 sandwiched between the connection tool 3 and the crushed portion 8 and the mating portions 11 are joined together with ultrasonic vibration.

According to Embodiment 3, connection having mechanical strength by caulking and high electric conductivity and high reliability by joining with ultrasonic vibration is effected without forming the relief hole 3*a* in the connection tool 3 as in Embodiment 1 and Embodiment 2.

Embodiment 4

Figure 4:
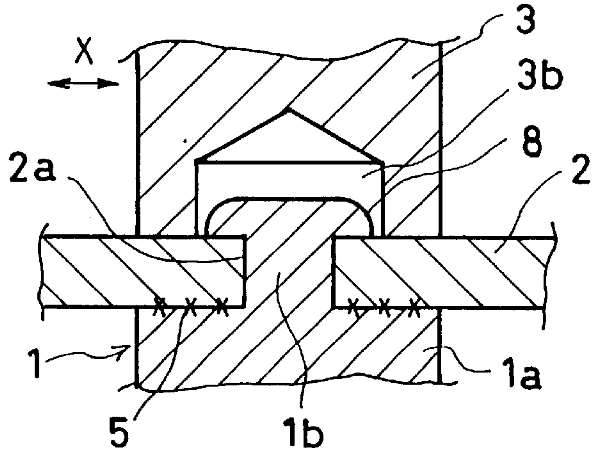
FIG. 4 is a sectional view of Embodiment 4 of the present invention.
Figure 5:
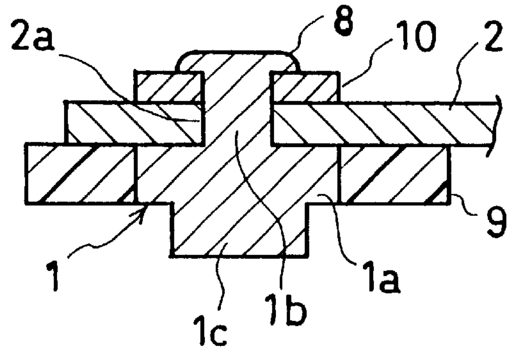
FIG. 5 PRIOR ART
FIG. 5 is a sectional view of a connected body of the prior art.

With reference to FIG. 4, a connected body and a connection method according to Embodiment 4 of the present invention will be described hereinafter. In Embodiment 4, the order of joining and caulking in Embodiment 1 is reversed. The connection tool 3 has an relief hole 3*b* which can contain the crushed portion 8. After the completion of caulking so that the portion projecting from the belt-like conductor laminate 2 of the stud 1*b* is crushed and the belt-like conductor laminate 2 is supported by the crushed portion 8 and the base 1*a*, the crushed portion 8 is contained in the relief hole 3*b* without contact, and the annular end surface around the relief hole 3*a* of the connection tool 3 presses the belt-like conductor laminate 2 around the crushed portion 8 with a predetermined pressure. In this state, the resonance of the connection tool 3 is transmitted through the inside of the belt-like conductor laminate 2 from the outside of the belt-like conductor laminate 2 and joins the mating portions 5.

In Embodiment 1 and Embodiment 4, the pressing member 9 may be used as in Embodiment 2 and Embodiment 3. On the contrary, in Embodiment 2 and Embodiment 3, the pressing member 9 may be omitted as in Embodiment 1 and Embodiment 4.

In Embodiments 1 to 4, the base 1*a* of the terminal 1 may be rod-shaped or belt-shaped.

In Embodiments 1 to 4, the stub 1*b* may be mated with the belt-like conductor laminate 2 by omitting the through hole 2*a* from the belt-like conductor laminate 2 and sticking the portion specified as the connection portion with the terminal 1 of the belt-like conductor laminate 2 into the stud 1*b*.

In Embodiments 1, 2 and 4, after the terminal 1 and the belt-like conductor laminate 2 are connected to each other by joining with ultrasonic vibration and caulking by crushing, part of the belt-like conductor laminate may be folded down and joined to the top surface of the crushed portion 8 with ultrasonic vibration as in Embodiment 3. In this case, though two connection tools 3 having an relief hole 3*a* or 3*b* and no relief hole are required, the number of portions joined with ultrasonic vibration is increased and electric reliability can be further improved.

According to the connected body of the first and second aspects of the present invention, since the terminal and the belt-like conductor laminate have portions joined with ultrasonic vibration and portions joined by caulking, high mechanical and electric reliabilities can be suitably exhibited for a long time.

According to the connection method of the third and fourth aspects of the present invention, since the terminal and the belt-like conductor laminate are joined together with ultrasonic vibration and caulked to each other, a connected body having high mechanical and electric reliabilities and comprising the terminal and the belt-like conductor laminate can be easily and advantageously obtained.

According to the connection method of the fifth aspect of the present invention, since ultrasonic vibration is suitably transmitted from the belt-like conductor laminate which is thinner than the terminal to the portion to be joined to the terminal, the terminal and the belt-like conductor laminate can be joined together firmly.

According to the sixth aspect of the present invention, since the stud and the through hole are mated with each other, the connection position of the terminal and the belt-like conductor laminate is accurately determined.

According to the seventh aspect of the present invention, connection having mechanical strength by caulking, electric conductivity by joining with ultrasonic vibration and high reliability is effected without forming a relief hole in the connection tool.

What is claimed is:

1. A method of connecting a terminal to a conductor, comprising the steps of:

(1) mating the terminal with the conductor through a thin stud of the terminal projecting from a base of the terminal;

(2) disposing the terminal and conductor between a connection tool and a workpiece mounting table with the base of the terminal and a portion of the conductor in the vicinity of the stud being in contact with each other at mating portions;

(3) applying a predetermined amount of pressure and ultrasonic vibration to the base of the terminal and the portion of the conductor by the connection tool to join them together at the mating portions;

(4) moving the connection tool away from the conductor and the base of the terminal to stop the application of the pressure and ultrasonic vibration; and (5) crushing a portion of the stud projecting above the conductor by applying pressure with a crushing tool such that the projecting portion of the stud spreads laterally so that at least a part of the mating portions of the base of the terminal and the conductor is not peeled off.

2. The method according to claim 1, wherein the ultrasonic vibration in step (3) is applied to the mating portions from a top side of the conductor.

3. The method according to claim 1, wherein the conductor is provided with a through hole, in which the stud is inserted so that the terminal is mated with the conductor.

4. The method according to claim 1, which further comprises the step of (6) disposing a pressing member on the conductor so as to fit the pressing member around the stud before step (4).

5. The method according to claim 4, which further comprises the step of (7) integrating a synthetic resin with the terminal before step (1).

* * * * *